United States Patent
Lin et al.

(10) Patent No.: US 6,856,087 B2
(45) Date of Patent: Feb. 15, 2005

(54) FULL-COLOR DISPLAY DEVICE

(75) Inventors: Ming-Der Lin, Hsinchu (TW); Kwang-Ru Wang, Chia Yi (TW); Shih-Cheng Huang, Taipei (TW); Ming-Fa Yeh, Keelung (TW); Yi-Tai Chung, Taichung (TW)

(73) Assignee: Highlink Technology Corporation, Hsinchu (TW)

( * ) Notice: Subject to any disclaimer, the term of this patent is extended or adjusted under 35 U.S.C. 154(b) by 76 days.

(21) Appl. No.: 10/336,818

(22) Filed: Jan. 6, 2003

(65) Prior Publication Data
US 2004/0070333 A1 Apr. 15, 2004

(30) Foreign Application Priority Data
Oct. 11, 2002 (TW) .......................... 91123521 A

(51) Int. Cl.⁷ ................................. H01J 1/62
(52) U.S. Cl. .................... 313/500; 345/45; 313/498
(58) Field of Search ................. 313/500, 505, 313/512, 498; 345/39, 76, 45, 82, 36; 257/89, 81, 99; 315/169.3

(56) References Cited

U.S. PATENT DOCUMENTS 6,340,824 B1 * 1/2002 Komoto et al. ............... 257/99
6,727,643 B2 * 4/2004 Suehiro ....................... 313/499

* cited by examiner

*Primary Examiner*—Vip Patel
*Assistant Examiner*—Glenn D. Zimmerman
(74) *Attorney, Agent, or Firm*—Sughrue Mion, PLLC

(57) ABSTRACT

A full-color display device is disclosed. The present invention comprises a plurality of pixel units each comprising a base, a plurality of transparent conductive substrates, a plurality of light emitting elements, and a plurality of electrode parts. The base has at least three openings formed thereon, the bottom of each opening is a reflective surface, and each of the transparent conductive substrates individually covers each opening. Each of the light emitting elements is individually disposed on one side of each transparent conductive substrate and held in each opening. Each of the electrode parts is formed on the base and electrically connected to the electrodes of the light emitting elements and the transparent conductive substrates.

58 Claims, 13 Drawing Sheets

FULL-COLOR DISPLAY DEVICE

FIELD OF THE INVENTION

The present invention relates to a display device, and more particularly, to a display device that can emit full-color light.

BACKGROUND OF THE INVENTION

In the conventional techniques regarding diodes, the light-emitting diode (LED) can be used as a pixel 11 of a monitor 10 (as shown in FIG. 1). Since the LED has excellent optoelectronic features of low power consumption, low heat generation, long operation life, good impact resistance, small size, fast responding speed, and stable emission wavelength, etc., the LED monitor has become one of the important directions of development in display devices currently. However, the light emitted by LED is of single-wavelength, hence the display device using a LED as a pixel can be merely used as a monochrome monitor.

With the progress of the age, the development in display devices is emphasized on making full-color monitors. To meet the challenge from the change of the time and the demands of users, the full-color LED monitor has become the main stream of the market gradually.

Please refer to FIG. 2. Each pixel 20 is composed of three LEDs in the conventional full-color LED monitor 25. That is, LED 21, LED 22, and LED 23 as shown in FIG. 2 can emit red light, green light, and blue light respectively. Therefore, the pixel 20 composed of three basic colors can emit full-color light. Moreover, please refer to FIG. 3. Full-color LED monitor 35 is the improvement of full-color LED monitors 25 shown in FIG. 2. Each pixel 30 is composed of four LEDs in the full-color LED monitor 35. That is, LED 31, LED 32, LED 33, and LED 34 as shown in FIG. 3 can emit red light, green light, blue light, and white light respectively. Therefore, once the LED 34 is electrically conducted, the pixel 30 can emit the white light. The description of the full-color LED monitor 35 can be referred to U.S. Pat. No. 5,998,925.

The structure of conventional LED adopted in the aforementioned traditional full-color LED monitor is shown in FIG. 4. The LED shown in FIG. 4 comprises a coating resin 401, a LED chip 402, a conductive wire 403, a molding material 404, a lead frame 405 and an inner lead 406, wherein the lead frame 405 comprises a base 405a and a lead 405b. The description of the aforementioned LED structure can be referred to U.S. Pat. No. 5,998,925. Hereinafter, the LED structure shown in FIG. 4 will be described in details.

Such as shown in FIG. 4, the coating resin 401 is filled in the base 405a to cover the LED chip 402, so as to prevent the LED chip 402 from contacting oxygen or moisture, thereby protecting the LED chip 402. The coating resin 401 is generally made of transparent material, such as epoxy resin, urea resin, or glass, etc. However, the thermal expansion coefficient and heat conductivity of the coating resin 401 are apparently different from those of the LED chip 402, so that the heat generated from the imperfect electro-optical conversion is easy to be accumulated on the interface between the coating resin 401 and the LED chip 402, while the optoelectronic element is in operation. Moreover, in the manufacturing process, it is quite important about how to use proper temperature and process for the coating resin 401 to be stably coated on or filled in the area surrounding the LED chip 402, and meanwhile, to assure that no extra chemical reaction between two different materials (the coating resin 401 and the LED chip 402) will occur. However, with the current technology, it usually needs to perform a baking step on the coating resin 401 at 150° C. for about 40 minutes, so as to cure the coating resin 401. Hence, for fitting to the current process, the coating resin 401 of high purity has to be selected as the material used for coating or filling (since some elements are easy to be diffused into semiconductor material to change the original properties of the semiconductor material).

The aforementioned structure also causes another bad influence. As the coating resin 401 is a poor heat conductor, heat is accumulated on the interface between two different materials (the coating resin 401 and the LED chip 402). Due to the difference in the thermal expansion coefficients between the coating resin 401 and the LED chip 402, while the element is in operation, heat accumulated therein causes additional stress exerted on the LED chip 402, wherein the stress is exactly proportional to the interface temperature (which is caused by the accumulated heat). While LED elements are developed towards the applications of high brightness and high power, the aforementioned problem will become more and more serious. Even on the current common applications, since the coating resin 401 and the LED chip 402 are different in material properties, the operation stability and life of the optoelectronic element are affected directly or indirectly.

Further, the LED chip 402 is a semiconductor element having a PN junction. Hence, when a positive voltage is applied to two electrodes of the LED chip 402, the light of specific wavelength will be emitted from the PN junction of the LED chip 402. In the aforementioned structure, the light emitted by the LED chip 402 towards the base 405a cannot be emitted again to the external, and thus the light emission intensity and efficiency of the entire LED device are affected. However, under the current structure, these shortcomings are inevitable.

Such as shown in FIG. 4, the coating resin 401 is used to fill in the base 405a to cover the LED chip 402, and the coating resin 401 may comprise fluorescent matter, such as phosphor. Besides, the coating resin 401 can be transparent material, such as epoxy resin, urine resin, or glass, etc. Moreover, the fluorescent matter contained in the coating resin 401 can change the light emission wavelength by the way of energy conversion, and the porosity and coating thickness of the fluorescent matter also affect the color of the colored light emitted after the wavelengths respectively generated by the LED and the fluorescent matter are mixed. However, on one hand, due to the oxidization reaction and the deterioration scheme of the coating resin 401, and on the other hand, due to the temperature influence and the UV light irradiation, the deterioration of the coating resin 401 and phosphor is thus accelerated. When the coating resin 401 is deteriorated and cured because of heat, or is damaged by the UV light in sunshine, the coating resin 401 has the phenomenon of curing and deteriorating. Once the coating resin 401 starts deteriorating, the LED chip 402 covered thereby will be affected and damaged. Especially for the element of which the waveband of light emitted is below that of blue light (wherein the wavelength of emitted light is smaller than 480 nm), because the LED chip 402 thereof has the attribute of spontaneous light-emission, and additionally, the light traveling path thereof is concentrated within a specific angle, resulting in high light emission intensity, consequently, the damage to the coating resin 401 is more sever. With the occurrence of these situations, the light-emitting device has the chance to be functionally retarded.

In the process for manufacturing the conventional LED, the LED chip 402 has to first be fixed on the base 405a.

Thereafter, the conductive wire 403 is formed between the LED chip 402 and the inner lead 406 in a manner of wire bond. Then, the coating resin 401 is filled in the base 405*a* to cover the LED chip 402 and part of the conductive wire 403. However, errors may occur in the process of fixing the LED chip 402, and the conductive wire 403 may not be able to be formed accurately on the bonding pad of the LED chip 402 while being formed on the LED chip 402, thus causing the LED chip 402 to be electrically nonconductive, resulting in manufacturing a defective LED.

To sum up, for the current development of full-color display devices, it is a problem about how to provide a full-color LED display device that can increase the light-emitting efficiency and prevent the light-emitting element (such as the aforementioned LED chip 402) from being damaged by the coating resin.

SUMMARY OF THE INVENTION

In accordance with the problems described in the aforementioned background of the invention, hence an objective of the present invention is to provide a full-color display device, thereby promoting the light-emitting efficiency.

The other objective of the present invention is to provide a full-color display device to prevent the light-emitting element from being damaged by the coating resin, thereby improving the operation stability and the life of the opto-electronic devices effectively.

To achieve the aforementioned objectives, a pixel unit of a full-color display device according to a first embodiment of this invention comprises a base, a plurality of transparent conductive substrates, a plurality of light-emitting elements, and a plurality of electrode parts.

Besides, a pixel unit of a full-color display device according to a second embodiment of this invention comprises a base, a transparent conductive substrate, a plurality of light-emitting elements, and a plurality of electrode parts.

In the aforementioned first embodiment of this invention, at least three openings are formed on the base, wherein the bottom of each opening is a reflective surface; and each opening is covered with the corresponding transparent conductive substrate. Moreover, on each transparent conductive substrate, a light-emitting element is disposed; the electrode of each light-emitting element and that of each transparent conductive substrate are electrically connected; and each light-emitting element is held in the corresponding opening respectively. Furthermore, the electrode parts are formed on the base so as to be electrically connected to the electrode of each transparent conductive substrate respectively. When each light-emitting element is disposed in each opening of the base, each light-emitting element may suspend from the bottom of each corresponding opening or contact the bottom of each corresponding opening.

Moreover, in this embodiment, each transparent conductive substrate further comprises a transparent plate, and a transparent electrode thin film and an insulating part both of which are formed on the transparent plate. Each transparent plate and each transparent electrode thin film are made of the material that is transparent relative to the waveband of each light-emitting element. Therefore, the light emitted by each light-emitting element can be emitted upwards directly, or can be emitted downwards and then reflected out through each reflective surface. Each insulating part divides each transparent electrode thin film into a first transparent electrode thin film area and a second transparent electrode thin film area that do not conduct each other, wherein each first transparent electrode thin film area and each second transparent electrode thin film area are electrically connected to the two electrodes of the light-emitting element respectively, and are electrically connected to each aforementioned electrode part respectively.

Besides, in the aforementioned second embodiment of this invention, an opening is formed on the base; the bottom of the opening is a reflective surface; and the opening is covered with the corresponding transparent conductive substrate. Moreover, on the transparent conductive substrate, at least three light-emitting elements are disposed; the positive electrode of each light-emitting element is electrically connected to the electrode of the transparent conductive substrate respectively; and each light-emitting element is held in the opening. Furthermore, two electrode parts are formed on the base so as to be electrically connected to the positive electrode and the negative electrode of the transparent conductive substrate respectively, wherein each light-emitting element held in the opening of the base may suspend from the bottom of the opening or contact the bottom of the opening.

Moreover, in this embodiment, the transparent conductive substrate is divided into a common negative area and at least three positive areas for electrically connecting the light-emitting elements.

In all aforementioned embodiments of this invention, when the light emitted by the light-emitting element is the white light, each reflective surface thereon further comprises a fluorescent layer used for changing the wavelength of the light reflected by the reflective surface, so as to emit the light outwards from each opening become red light, green light, and blue light respectively.

Since the full-color display device of the present invention uses the reflective surface to reflect out the light emitted downwards by the light-emitting element, hence the light emitted by the light-emitting element can be led to the exterior of the full-color display device effectively via the aforementioned design, thereby increasing the light emission efficiency of the full-color display device. Moreover, in the full-color display device of the present invention, the light-emitting element is disposed in a space between the transparent conductive substrate and the bottom of the opening, wherein the space does not need to be filled with any coating resin, thus preventing the light-emitting element from being damaged by the coating resin.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Hereinafter, a full-color display device is explained by referring to the related figures, according to preferred embodiments of the present invention, wherein same reference numbers are used for the same elements for explanation.

Figure 1:
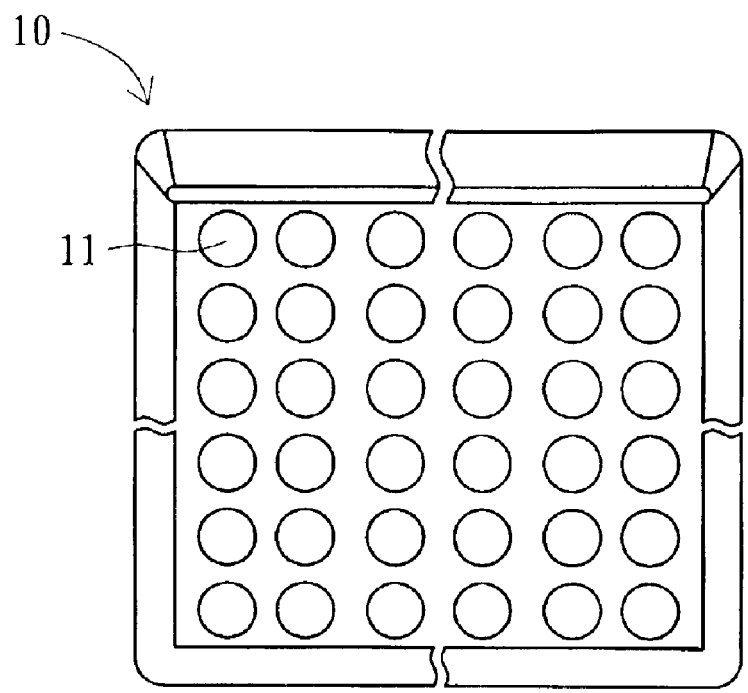
FIG. 1 is a diagram showing the structure of the conventional monochrome LED display device.
Figure 2:
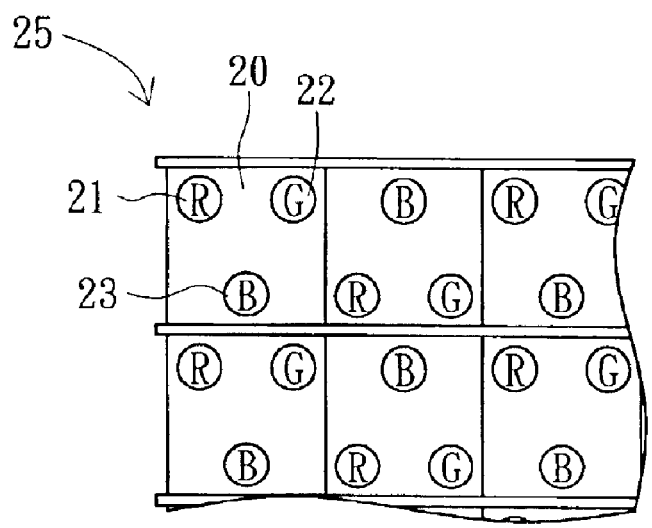
FIG. 2 is a diagram showing the structure of the conventional full-color LED display device, wherein each pixel is composed of three light-emit elements of three different colors.
Figure 3:
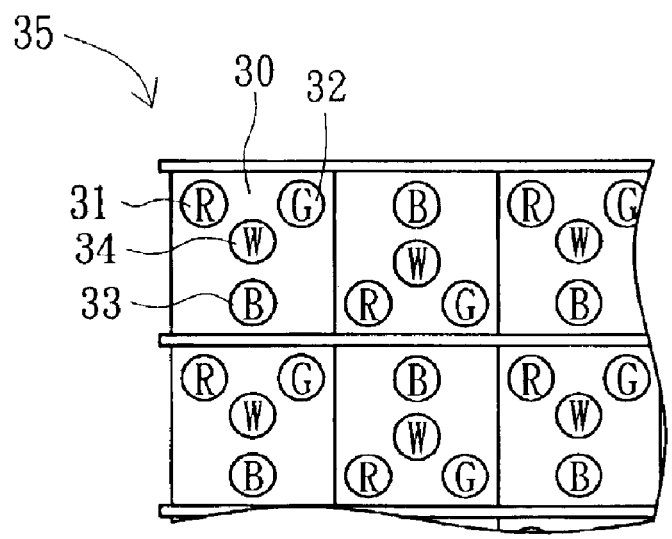
FIG. 3 is a diagram showing the structure of another conventional full-color LED display device, wherein each pixel is composed of four light-emit elements of four different colors.
Figure 4:
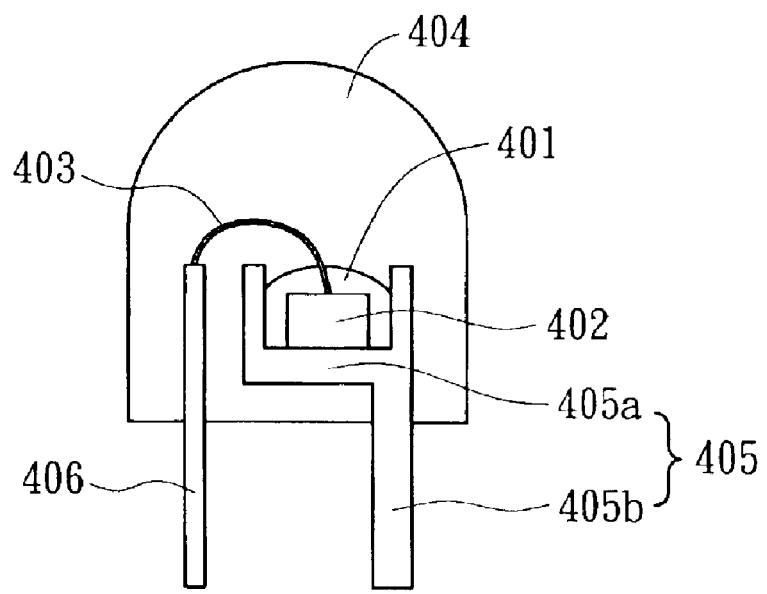
FIG. 4 is a diagram showing the structure of the conventional LED.
Figure 5A:
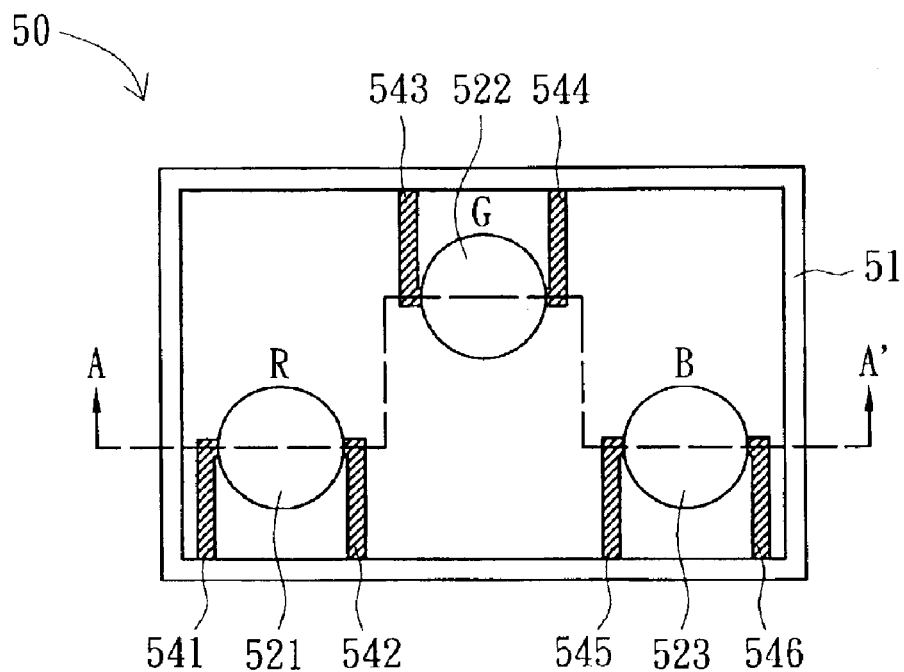
FIG. 5A is a diagram showing the top view of a pixel unit of the full-color LED display device according to an embodiment of this invention.
Figure 5B:
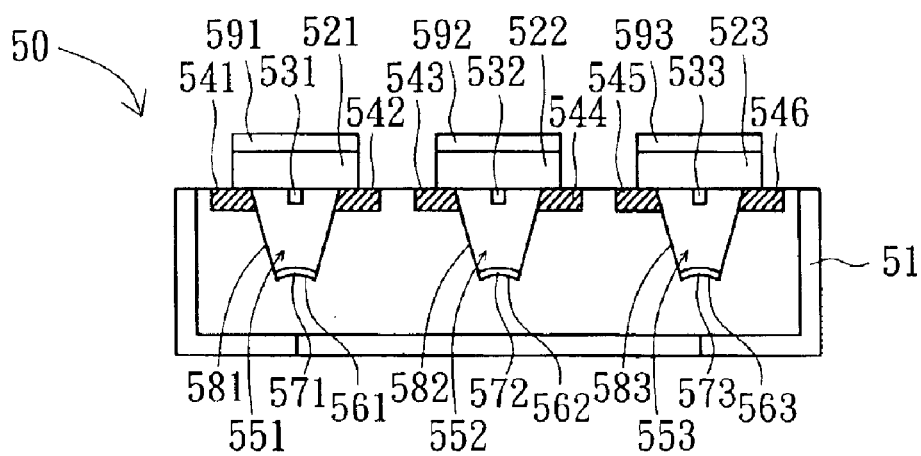
FIG. 5B is a diagram showing the cross section viewed along the AA' line in FIG. 5A.

Please refer to FIG. 5A showing the top view of a pixel unit of the full-color LED display device according to an embodiment of this invention, and to FIG. 5B showing the cross section viewed along the AA' line in FIG. 5A. A full-color LED display device 50 shown in FIG. 5B comprises a base 51, a transparent conductive substrate 521, a transparent conductive substrate 522, a transparent conductive substrate 523, a light-emitting element 531, a light-emitting element 532, a light-emitting element 533, an electrode part 541, an electrode part 542, an electrode part 543, an electrode part 544, an electrode part 545, and an electrode part 546.

In this embodiment, an opening 551, an opening 552, and an opening 553 are formed on the base 51. The bottoms of the opening 551, the opening 552, and the opening 553 are respectively a reflective surface 561, a reflective surface 562, and a reflective surface 563. The electrode part 541, the electrode part 542, the electrode part 543, the electrode part 544, the electrode part 545, and the electrode part 546 are formed on the base 51. As shown in FIG. 5B, the transparent conductive substrates 521–523 cover the openings 551–553 respectively. Each of the light-emitting elements 531–533 is disposed on one side of each of the transparent conductive substrates 521–523 respectively, and is held in each of the openings 551–553 respectively. The electrodes (not shown) of the light-emitting elements 531–533 are electrically connected to the electrodes (not shown) of the transparent conductive substrates 521–523 respectively in a way of wire bond or flip-chip. Moreover, the electrodes (totally six electrodes) of the transparent conductive substrates 521–523 are further electrically connected to the electrodes 541–546 respectively. That is, the electrodes of the light-emitting elements 531–533 are electrically connected to the electrodes 541–546 respectively via the electrodes of the transparent conductive substrates 521–523.

In the present embodiment, the material of the base 51 can be ceramic material, metal material, alloy material, crystalline material, or semiconductor material.

Furthermore, in the full-color LED display device according to the present embodiment, spaces of the openings 551–553 can be filled with gas, such as air or nitrogen, or can be at vacuum stat. When the spaces in the openings 551–553 are filled with gas, the damage caused by the coating resin to the light-emitting elements 531–533 can be avoided. Those who are skilled in the art should be able to understand that the spaces in the openings 551–553 can also be filled with transparent colloid containing fluorescent material to achieve the expected light emission effect. Moreover, light-reflective layers 581–583 are further coated on the inner walls of the openings 551–553 to reflect light. Further, the inner walls of the openings 551–553 can be orthogonal to the reflective surfaces 561–563 (not shown) respectively, or not orthogonal but as convex curved surfaces (such as shown in FIG. 5B) or concave curved surfaces. Furthermore, according to the top views of the shapes of the openings 551–553, the shapes are not limited to circles, but can be rectangular, trapezoid, or elliptic. In other words, without violating the scope of the inventive spirit of the present invention, those who are skilled in the art should be able to design the openings 551–553 and the reflective surfaces 561–563 of different shapes.

Moreover, in this embodiment, the electrode parts 541–546 can be formed on two sides of the openings 551–553, and these electrode parts 541–546 can be surface mounted devices (SMD) formed by using surface mounted technology (SMT).

It is worthy to be noted that, besides the electrode parts having the form of SMD, the full-color display device, according to the present embodiment, can also be a LED lamp, a LED backlight, a LED high power package or a LED cell (COB LED), etc. Because of the specific structure of the present invention and the adopted various designs about heat-dissipation and light leading, the present invention is very suitable for use in the high power elements and the packaging of the high light emission efficiency.

Figure 7:
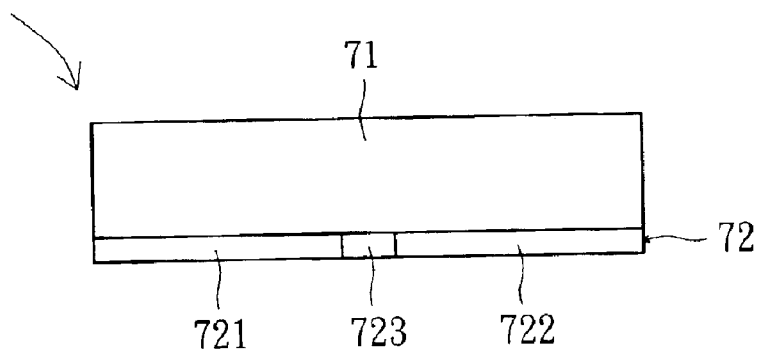
FIG. 7 is a diagram showing the transparent conductive substrate of the full-color LED display device according to an embodiment of this invention.

Furthermore, as shown in FIG. 7, each of the transparent conductive substrates 521–523 comprises a transparent plate 71, a transparent electrode thin film 72 formed on the transparent plate 71, and an insulating part 723, wherein the insulating part 723 divides the transparent electrode thin film 72 into a first transparent electrode thin film area 721 and a second transparent electrode thin film area 722 that are not mutually conducted to each other. The first transparent electrode thin film area 721 and the second transparent electrode thin film area 722 are just the electrodes of the aforementioned transparent conductive substrates 521–523. As to the transparent plate 71, it is a substrate made of light-permissible material, such as an $Al_2O_3$ substrate, a ceramic substrate, an amorphous substrate, or a polymer substrate, wherein the $Al_2O_3$ substrate can be such as a sapphire substrate; the amorphous substrate can be made of such as glass; and the polymer substrate can be such as an acrylic plate.

Please refer to FIG. 5B and FIG. 7 simultaneously. When the transparent conductive substrates 521–523 are disposed on the openings 551–553, the first transparent electrode thin film areas 721 of the transparent conductive substrates 521–523 contact the electrode parts 541, 543, and 545 respectively, and the second transparent electrode thin film areas 722 of the transparent conductive substrates 521–523 contact the electrode parts 542, 544, and 546 respectively. Moreover, the electrode parts 541, 543, and 545 are further electrically connected to the negative electrode respectively, and the electrode parts 542, 544, and 546 are further electrically connected to the positive electrode respectively. Therefore, when the electrode parts 541, 543, and 545 are charged with negative voltage, and the electrode parts 542, 544, and 546 are charged with positive voltage, each of the first transparent electrode film areas 721 and each of the second transparent electrode film areas 722 can be electrically conducted simultaneously, thereby respectively charging two electrodes of the light-emitting elements 531–533 so as to enable the light-emitting elements 531–533 to emit light. The material of the first transparent electrode film area 721 and that of the second transparent electrode film area 722 can be selected from a group consisting of ITO, ZnO, CTO, IZO, $ZrO_2$, and AZO. Besides, in addition to the aforementioned materials, the thin metal electrode made of a plurality of metal layers selected from a group composed of Ni, Ag, Al, Ti, Cr, Au, Pt, W, $WSi_2$, Zn, In, and Al—Si alloy can be used as the transparent electrode thin film. Furthermore, those who are skilled in the art should be able to understand that, according to the disposition of the light-emitting elements 531–533, the electrode parts 541, 543, and 545 can be alternatively electrically connected to the positive electrode respectively, and the electrode parts 542, 544, and 546 can be electrically connected to the negative electrode respectively so as to enable the light-emitting elements 531 to 533 to be operated under the condition of forward bias, thereby achieving the expected light emission effect.

Further, in the present embodiment, the light-emitting elements 531–533 can be any light-emitting semiconductor element, such as a LED, an organic light-emitting diode (OLED) or a laser diode, etc.

In the present embodiment, the light emission wavebands of the light-emitting elements 531–533 can be red, green, blue, and ultraviolet. More detailedly speaking, under the condition of no changing the light emission wavelength, the reflective surfaces 561–563 can reflect the light emitted by the light-emitting elements 531–533 respectively. In addition, when the transparent conductive substrates 521–523 are disposed on the openings 551–553 respectively, the light-emitting elements 531–533 are located in the openings 551–553 and between the transparent conductive substrates 521–523 and the reflective surfaces 561–563 respectively, and the light-emitting elements do not contact the reflective surfaces 561–563 respectively. Therefore, the lights emitted by the light-emitting elements 531–533 can penetrate directly the transparent conductive substrates 521–523 respectively and then emit outwards, or can be firstly reflected by the reflective surfaces 561–563 respectively, then penetrate the transparent conductive substrates 521–523 respectively, and finally emit outwards.

Besides, in the present embodiment, when the wavebands of the light-emitting elements 531–533 belong to blue light and ultraviolet light, the reflective surfaces 561–563 further comprise the fluorescent layers 571–573 respectively so as to change the wavelengths of the light reflected by the reflected surfaces 561–563, thereby changing the color of the light emitted out by the display device and combining the three basic colors into the full-color light. The fluorescent layers 571–573 can contain different florescent materials respectively, such as phosphor, and the porosity, and thickness of the florescent materials in the florescent layers 571–573 can affect the colors of the lights emitted. For example, the fluorescent layer 571 can change the wavelength of the light reflected by the reflective surface 561 so as to emit the red light; the fluorescent layer 572 can change the wavelength of the light reflected by the reflective surface 562 so as to emit the green light; and the fluorescent layer 573 can change the wavelength of the light reflected by the reflective surface 563 so as to emit the blue light.

Figure 5C:
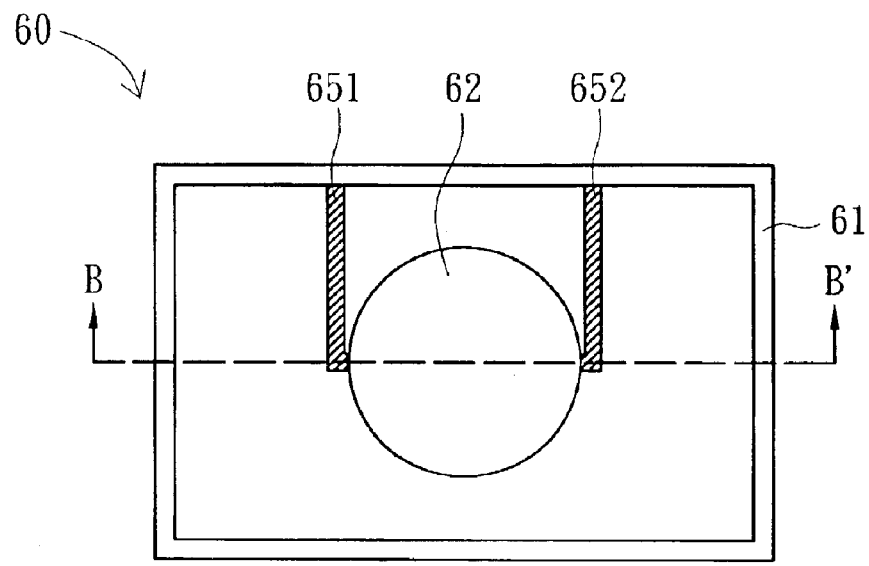
FIG. 5C is a diagram showing the top view of a pixel unit of the full-color LED display device according to another embodiment of this invention.
Figure 5D:
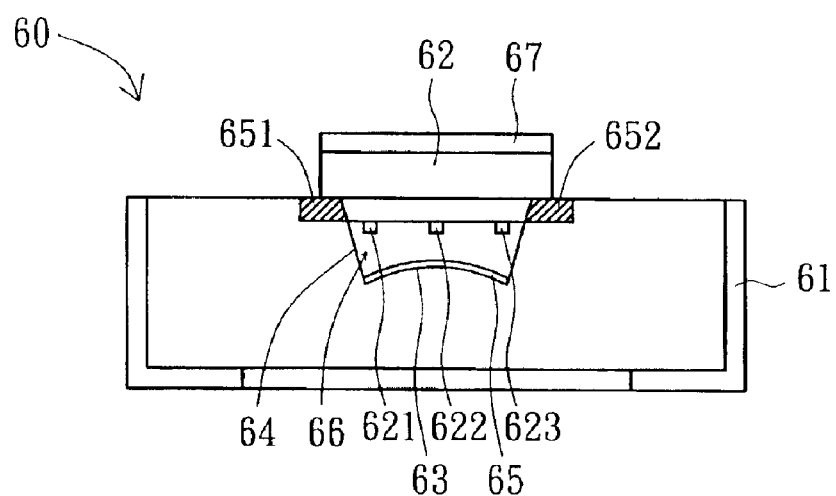
FIG. 5D is a diagram showing the cross section viewed along the BB' line in FIG. 5A.

Please refer to FIG. 5C showing the top view of a pixel unit of the full-color LED display device according to another embodiment of this invention, and to FIG. 5D showing the cross section viewed along the BB' line in FIG. 5C. A full-color LED display device 60 shown in FIG. 5D comprises a base 61, a transparent conductive substrate 62, a light-emitting element 621, a light-emitting element 622, a light-emitting element 623, an electrode part 651, and an electrode part 652.

In this embodiment, an opening 66 is formed on the base 61; the bottom of the opening 66 is a reflective surface 63; and the electrode part 651 and the electrode part 652 are formed on the base 61. As shown in FIG. 5D, the transparent conductive substrate 62 covers the opening 66. Light-emitting elements 621–623 are disposed on one side of the transparent conductive substrate 62, and are held in the opening 66. Three positive electrodes (not shown) and three negative electrodes (not shown) of the light-emitting elements 621–623 are electrically connected to three positive electrodes (not shown) and a common negative (not shown) of the transparent conductive substrate 62 respectively in a way of wire bond or flip-chip. The three positive electrodes and the common negative electrode of the transparent conductive substrates 62 are further electrically connected to the electrode 651 and the electrode 652 respectively. That is, the electrodes of the light-emitting elements 621–623 are electrically connected to the electrode 651 and the electrode 652 respectively via the electrodes of the transparent conductive substrate 62.

In the present embodiment, the material of the base 61 can be ceramic material, metal material, alloy material, crystalline material, or semiconductor material.

Furthermore, in the full-color LED display device according to the present embodiment, the space of the opening 66 can be filled with gas, such as air or nitrogen, or can be at vacuum stat. When the space in the opening 66 is filled with gas, the damage caused by the coating resin to the light-emitting element 621–623 can be avoided. Those who are skilled in the art should be able to understand that the space in the opening 66 can also be filled with transparent colloid containing fluorescent material to achieve the expected light emission effect. Moreover, a light-reflective layer 64 can further be coated on the inner wall of the opening 66 to reflect light. Further, the inner wall of the opening 66 can be orthogonal to the reflective surface 63 (not shown), or not orthogonal but as a convex curved surface (such as shown in FIG. 5D) or a concave curved surface. Furthermore, from the top view of the shape of the opening 66, the shape is not limited to circles, but can be rectangular, trapezoid, or elliptic. In other words, without violating the scope of the inventive spirit of the present invention, those who are skilled in the art should be able to design the opening 66 and the reflective surface 63 of different shapes.

Figure 8:
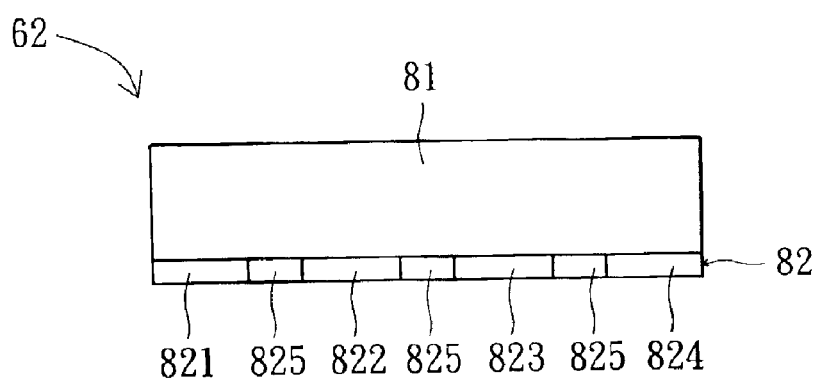
FIG. 8 is a diagram showing the transparent conductive substrate of the full-color LED display device according to another embodiment of this invention.

Moreover, in this embodiment, the electrode part 651 and the electrode part 652 can be formed on two sides of the opening 66, and the electrode part 651 and the electrode part 652 can be surface mounted devices (SMD) formed by using surface mounted technology (SMT). It is worthy to be noted that, besides the electrode parts having the form of SMD, the full-color display device, according to the present embodiment, can also be a LED lamp, a LED backlight, a LED high power package or a LED cell (COB LED), etc. Because of the specific structure of the present invention and the adopted various designs about heat-dissipation and light leading, the present invention is very suitable for use in the high power elements and the packaging of the high light emission efficiency. Furthermore, such as shown in FIG. 8, the transparent conductive substrate 62 comprises a transparent plate 81, a transparent electrode thin film 82 formed on the transparent plate 81, and three insulating parts 825, wherein the insulating parts 825 divide the transparent electrode thin film 82 into transparent electrode thin film areas 821–823 used as positive electrodes of the transparent conductive substrate 62 and a transparent electrode thin film area 824 used as a negative electrode of the transparent conductive substrate 62, wherein those transparent electrode thin film areas are not mutually conducted to each other. As to the transparent plate 81, it is a substrate made of light-permissible material, such as an $Al_2O_3$ substrate, a ceramic substrate, an amorphous substrate, or a polymer substrate, wherein the $Al_2O_3$ substrate can be such as a sapphire substrate; the amorphous substrate can be made of such as glass; and the polymer substrate can be such as an acrylic plate.

Please refer to FIG. 5D and FIG. 8 simultaneously. When the transparent conductive substrate 62 is disposed on the opening 66, the electrode part 651 and the electrode part 652 on the base 61 can be electrically connected to the transparent electrode thin film areas 821–823 used as the positive electrode of the transparent conductive substrate 62 and to the transparent electrode thin film area 824 used as the negative electrode of the transparent conductive substrate 62 respectively, thereby achieving electrical conductivity and enabling the light-emitting elements 621–623 to emit light. The material of the transparent electrode film areas 821–824 can be selected from a group consisting of ITO, ZnO, CTO, IZO, $ZrO_2$, and AZO. Besides, in addition to the aforementioned materials, the thin metal electrode made of a plurality of metal layers selected from a group composed of Ni, Ag, Al, Ti, Cr, Au, Pt, W, $WSi_2$, Zn, In, and Al—Si alloy can be used as the transparent electrode thin film. Furthermore, those who are skilled in the art should be able to understand that, according to the dispose of the light-emitting elements 621–623, the electrode parts 651 and the electrode part 652 can be alternatively electrically connected to the negative electrode and the positive electrode so as to enable the light-emitting elements to be operated under the condition of forward bias, thereby achieving the expected light emission effect.

Further, in the present embodiment, the light-emitting elements 621–623 can be any light-emitting semiconductor element, such as a LED, an OLED or a laser diode, etc.

In the present embodiment, the light emission wavebands of the light-emitting elements 621–623 can belong to red light, green light, blue light, and ultraviolet light. Speaking in more details, the reflective surface 63 can reflect the light emitted by the light-emitting elements 621–623 respectively. In addition, when the transparent conductive substrate 62 is disposed on the opening 66, the light-emitting elements 621–623 are located in the opening 66 and between the transparent conductive substrate 62 and the reflective surface 63 without contacting the reflective surface 63. Therefore, the light emitted by the light-emitting elements 621–623 can penetrate directly the transparent conductive substrate 62 and then emit outwards, or can be firstly reflected by the reflective surface 63, then penetrate the transparent conductive substrate 62, and finally emit outwards.

Besides, in the present embodiment, when the wavebands of the light-emitting elements 621–623 belong to white light and pink light, the reflective surface 63 further comprises the fluorescent layer 65 used for changing the wavelength of the white light reflected by the reflected surface 63, thereby changing the color of the light emitted out by the full-color LED display device 60 and enabling the full-color LED display device 60 to emit the full-color light.

Therefore, according to the aforementioned embodiments, the appropriate fluorescent layers 571–573 as shown in FIG. 5B and the appropriate fluorescent layer 65 as shown in FIG. 5D can be chosen to convert the light emitted by the active layer into the monochrome having different wavelength by the way of energy conversion (using the light emitted by the active layer to excite the phosphor). For example, the ultraviolet-light laser diode can excite the phosphor to produce white light, red light, green light, and blue light, etc. Alternatively, the colored light having the mixed multi-wavelengths can be produced by this way. For example, the white light can be generated by mixing the blue light emitted by the blue-light LED with the yellow light produced by exciting the garnet phosphor with the LED.

Moreover, an optically-filtering coating having anti-reflection and optically-filtering effects is further formed on the adopted transparent conductive substrate in the present invention. According to the aforementioned two embodiments of the present invention, this optically-filtering coating is used just as the optically-filtering coatings 591–593 as shown in FIG. 5B and the optically-filtering coating 67 as shown in FIG. 5D. The material of this anti-reflection coating can be selected from a group consisting of $SiO_2$, $SiO_x$, $SiN_x$, $Al_2O_3$, $TiO_2$, $Ta_2O_5$, TEOS, epoxy resin, ITO, ZnO, CTO, IZO, $ZrO_2$, AZO and polyimide, etc.

When a laser diode is used as an active light-emitting element for manufacturing a full-color display device of high brightness and high color rendition, the aforementioned optically-filtering coating can be used to be a special layer controlling the light emission angle. Especially, when an ultraviolet laser diode is used as an active light-emitting element exciting the phosphor to produce light of monochrome such as red, green, or blue, etc., or white light, the aforementioned optically-filtering coating having optically-filtering effect can achieve the function of filtering the ultraviolet light, thereby solving the problems that the output power of the ultraviolet light is very strong; the ultraviolet light is not the color expected to render; and the ultraviolet light is harmful to the human body. Meanwhile, when an active element is used to excite the phosphor to produce a single-color light for manufacturing a full-color display device, the aforementioned coating can be further designed to be an optically-filtering coating having anti-reflection and optically-filtering effects, thereby increasing the operation efficiency of the device. Especially, when a laser diode of visible light is used to be the excitation source, the optically-filtering coating having anti-reflection and optically-filtering effects can filter the unwanted colored lights effectively, thereby preventing any light-mixing phenomenon and enhancing the color purity and the color rendition performance of the full-color display device. Therefore, the full-color display device, according to an embodiment of the present invention, can emit pure red, green, and blue light and the red, green, and blue light can be mixed into the full-color light.

It has to be noted that the aforementioned content is merely used as the examples according to the present invention, and does not limit the present invention. Without violating the scope of the inventive spirit of the present invention, those who are skilled in the art should be able to make changes arbitrarily.

Taking FIG. 5B as an example, the light-emitting elements 531–533 can be active optoelectronic elements emitting the red, green, blue, and ultraviolet lights; and the reflective surfaces 561–563 thereon can comprise the fluorescent layers 571–573 respectively and selectively according the functional demands. When the reflective surfaces 561–563 thereon comprise the fluorescent layers 571–573 respectively, the fluorescent layers 571–573 can absorb the light emitted by the light-emitting elements 531–533 respectively, and then the light can be converted into another kinds of colored light by energy conversion. Alternatively, by the way of mixing multi-wavelengths, the light emitted by the light-emitting elements 531–533 and the colored light produced by the excited phosphor can be mixed into another colored light. Therefore, just by the method similar to the aforementioned one, either the light emitted by the light-emitting elements 531–533, or the light produced by first exciting the phosphors and then mixing the multi-wavelengths after the light-emitting elements 531–533 emit the lights, used to enable the light emitted out from the transparent conductive substrates 521–523 respectively to be the three basic colored light of red, green, and blue, both can be used to manufacture the full-color display device of high brightness and high color rendition in the same way.

Figure 5E:
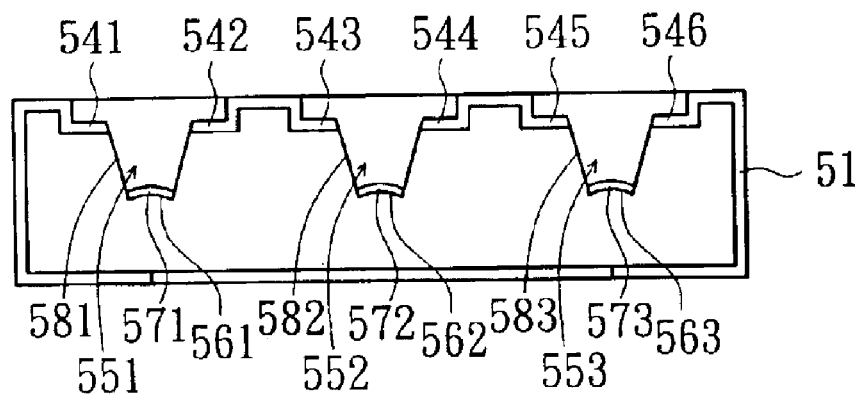
FIG. 5E is a diagram showing the cross sectional view of the base of the pixel unit of the full-color LED display device according to an embodiment of this invention, wherein the base has an inner wall of stair shape, and the reflective surface is a convex curved surface.
Figure 5F:
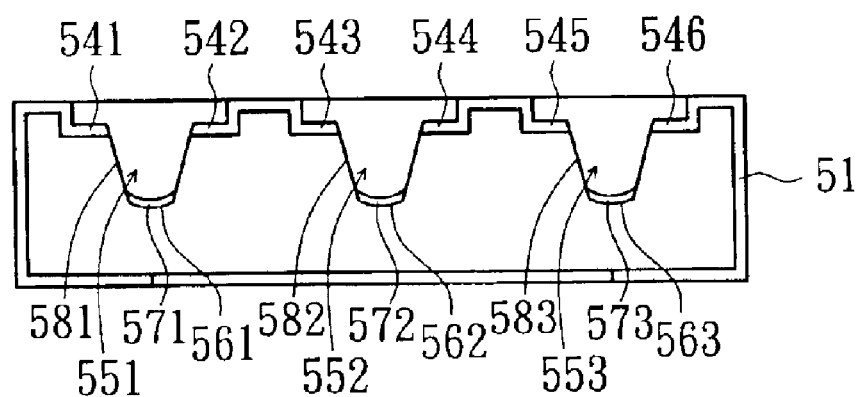
FIG. 5F is a diagram showing the cross sectional view of the base of the pixel unit of the full-color LED display device according to another embodiment of this invention, wherein the base has an inner wall of stair shape, and the reflective surface is a concave curved surface.
Figure 5G:
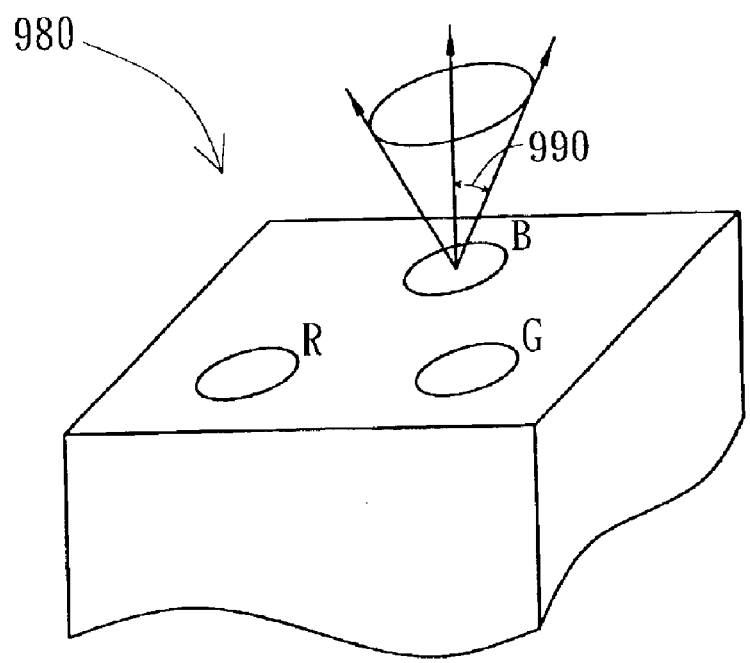
FIG. 5G is a diagram showing the angle range in which the light is emitted by the light-emitting element of the pixel unit of the full-color LED display device according to this invention.
Figure 5H:
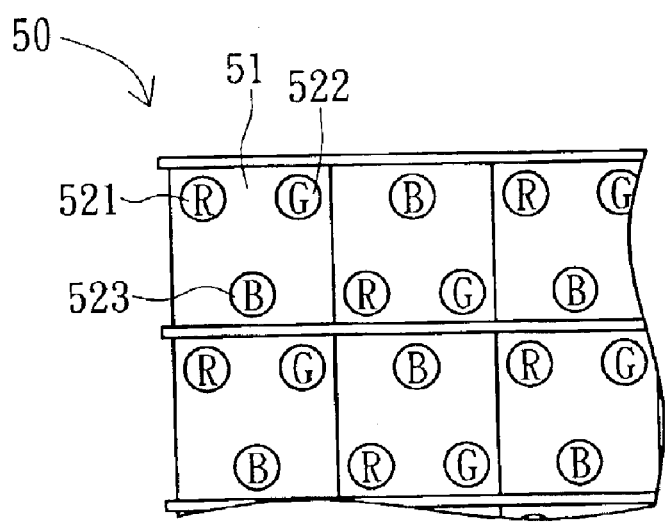
FIG. 5H is a diagram showing the full-color LED display device having a plurality of pixel units such as showed in FIG. 5A according to an embodiment of this invention.

Therefore, such as shown in FIG. 5H, the full-color LED display device 50 composed of the base 51, the transparent conductive substrates 521–523, the light-emitting elements 531–533, and the electrode parts 541–546, etc. as shown in FIG. 5B. In FIG. 5H, each of the pixels can be formed by the way of emitting outwards the red light R, the green light G, and the blue light B through the transparent conductive substrates 521–523, so that each of the pixels can emit the full-colored light.

Furthermore, as shown in FIG. 5E, the cross sections of the base 51 between the open ends of the openings 551–553 of the base 51 and the reflective surfaces 561–563 can be of stair-shape. Therefore, when the transparent conductive substrates 521–523 are disposed on the openings 551–553, there will be self-aligning effect for the transparent conductive substrates 521–523 to be disposed conveniently. Besides, the reflective surfaces 561–563 can be convex curved surfaces having convex central parts (FIG. 5E), or concave curved surfaces having concave central parts (FIG. 5F). When the reflective surfaces 561–563 are convex curved surfaces having convex central parts, the emission angles of the reflected lights can be increased, thereby increasing the range of the lights emitted by the full-color display device. When the reflective surfaces 561–563 are concave curved surfaces having concave central parts, the emission angles of the reflected lights can be changed easily. That is, in a pixel unit 980 as shown in FIG. 5G, a half-angle range 990 of the light emitted by a light-emitted element can be decided by the curvature of the concave curved surface. Therefore, a module emitting lights in arbitrary angles can be made easily by applying pixels of this design and according the demand of the visual angle of an observer. At the same time, by using this design and applying the modulized manufacturing method, the full-color LED display monitors of arbitrary sizes can be fabricated.

Figure 6A:
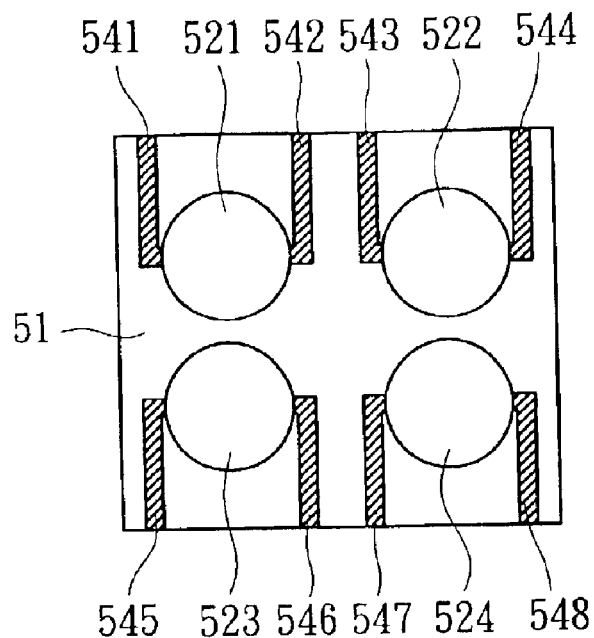
FIG. 6A is a diagram showing the top view of a pixel unit of the full-color LED display device according to still another embodiment of this invention.
Figure 6B:
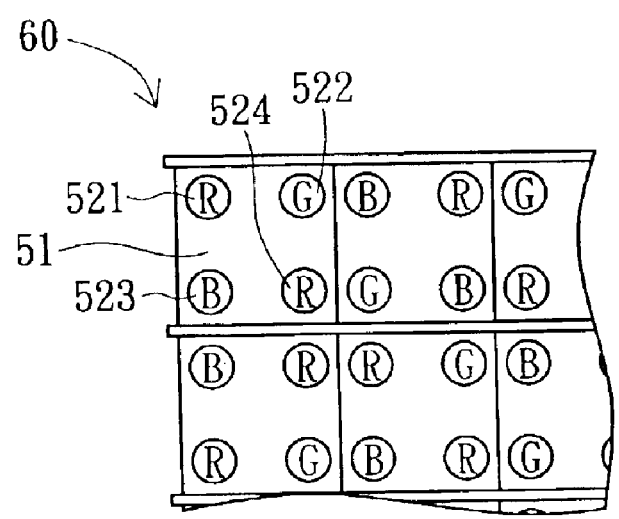
FIG. 6B is a diagram showing the full-color LED display device having a plurality of pixel units such as showed in FIG. 6A according to still another embodiment of this invention.

Please refer to FIG. 6A showing the top view of a pixel unit of the full-color LED display device according to still another embodiment of this invention, and to FIG. 6B showing the full-color LED display device having a plurality of pixel units such as showed in FIG. 6A. A full-color LED display device 60 shown in FIG. 6B comprises a plurality of pixel units as shown in FIG. 6A, wherein the pixel unit shown in FIG. 6A comprises a base 51, four transparent conductive substrates 521–524, four light-emitting elements (not shown), and eight electrode parts 541–548.

The present embodiment is different from the aforementioned embodiments in the quantity of openings, transparent conductive substrates, light-emitting elements, and electrode parts forming a pixel unit. In the aforementioned first embodiment, a pixel unit is composed of three sets of openings, transparent conductive substrates, light-emitting elements, and electrode parts. However, in the present embodiment, a pixel unit is composed of four sets of openings, transparent conductive substrates, light-emitting elements, and electrode parts. In the present embodiment, the structure of the base, openings, transparent conductive substrates, light-emitting elements, and electrode parts are similar to the ones mentioned above, and will not be addressed detailedly again.

As shown in FIG. 6A, the electrode parts 541–548 are electrically connected to two sides of the transparent conductive substrates 521–524 respectively, and lights emitted through the transparent conductive substrates 521–524 are red light, green light, blue light, and red light respectively. It has to be noted that those who are skilled in the art should be able to understand that the light emitted through the transparent conductive substrates 521–524 can be in other combinations. For example, the light emitted through the transparent conductive substrates 521–524 can be red light, green light, blue light, and white light respectively, or red light, blue light, green light, and red light respectively.

As shown in FIG. 6B, the full-color LED display device 60 is a plurality of sets of the aforementioned base 51, transparent conductive substrates 521–524, light-emitting elements (not shown), and electrode parts 541–548, so that each of the pixels can emit full-color light. Moreover, those who are skilled in the art should be able to understand that in each of the pixels, the light emitted through the transparent conductive substrates 521–524 can be in arbitrary combinations as the aforementioned, and different pixels can be of different combinations.

Figure 6C:
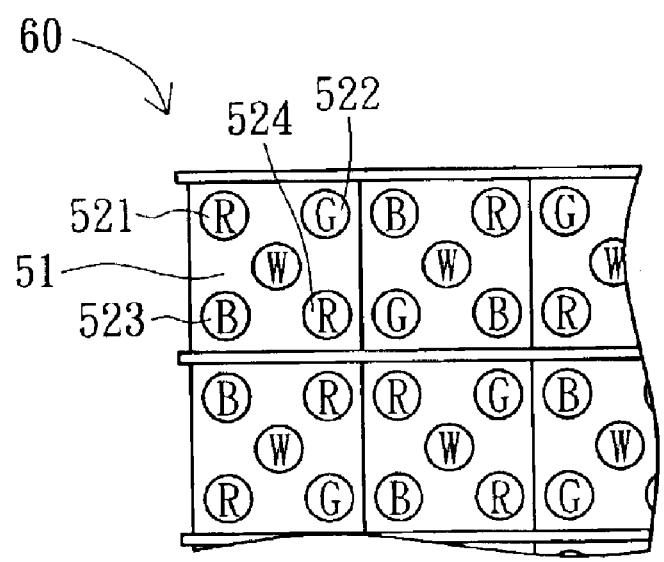
FIG. 6C is a diagram showing the full-color LED display device according to still another embodiment of this invention, thereby further emitting the white-color light.

Furthermore, those as shown in FIG. 6B can also be changed to the condition having a white light as shown in FIG. 6C.

Figure 9:
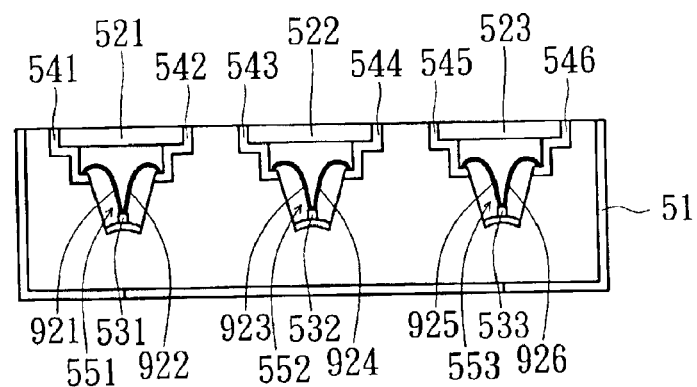
FIG. 9 is a diagram showing a pixel unit of the full-color LED display device according to an embodiment of this invention, wherein the light-emitting element is located on the bottom of the opening; the light-emitting element is directly electrically connected to the electrode part; and the cross section of the electrode part is of two-stairs shape.

In all aforementioned embodiments, all the light-emitting elements are suspended from the bottoms of all the openings. However, all the light-emitting elements can also contact the bottoms of all the openings. For example, as shown in FIG. 9, the light-emitting elements 531–533 in the present invention can be disposed on the openings 551–553 respectively and electrically connected to the electrode parts 541–546 directly via the conductive wires 921–926, wherein the cross section of the base 51 can be of two stairs shape, thereby providing the use for self-aligning the transparent conductive substrates 521–523. Those who are skilled in the art should be able to understand that the structure in which the light-emitting element contacts the bottom of the opening can be applied easily in all the aforementioned embodiments.

To sum up, since the full-color display device of the present invention uses the reflective surface to reflect out the light emitted downwards by the light-emitting element, hence the light emitted by the light-emitting element can be led to the exterior of the full-color display device effectively via the aforementioned design, thereby increasing the light emission efficiency of the full-color display device. Moreover, in the full-color display device of the present invention, the light-emitting element is disposed in a space between the transparent conductive substrate and the bottom of the opening, and the space does not need to be filled with any coating resin, thus preventing the light-emitting element from being damaged by the coating resin.

Please refer to FIG. 5B, FIG. 5D, FIG. 5E, FIG. 5F, and FIG. 9 again. The spaces in the opening 551, the opening 552, the opening 553, and the opening 66 can further be filled with any electrically non-conductive liquid that can assist the heat dissipation. Particularly, when the spaces in the opening 551, the opening 552, the opening 553, and the opening 66 are filled with the heat-dissipating material such as electrically non-conductive liquid, the naturally cooling effect will be achieved due to heat convection. When the spaces in the opening 551, the opening 552, the opening 553, and the opening 66 are filled with liquid, the liquid can be the material having proper refraction index, and additionally, the technology of refractory index matching can be used to increase the light emission efficiency. For example, the liquid $TiO_2$ of which the refraction index is about 2.0 and the deionized water (DI Water) of which the refraction index is about 1.5 both will have better effect than epoxy resin of which the refraction index is about 1.4, and the former also can enhance the heat-dissipation effect. Or, the DI water can also be wrapped in soft gel to form a sealed space filled in the spaces in the opening 551, the opening 552, the opening 553, and the opening 66, thereby attaining the purpose of dissipating heat and increasing the effect of light emission. This advantage combining the disclosed full-color display device that can adjust the light emitting angle arbitrarily, will make the full-color display device of the present invention become highly suitable for use in the system of high power.

Figure 10:
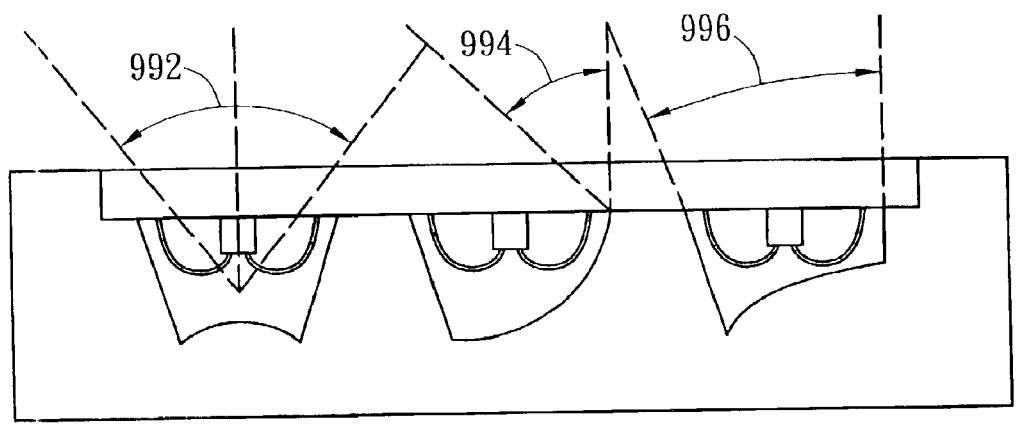
FIG. 10 is a diagram showing the full-color display device according to this invention, wherein the device can be designed to emit light in a full angle or a half angle according to the actual demand.

Moreover, when a full-color display device is designed and manufactured according the present invention, different light emission angles of arbitrary kinds of colored light can be designed according to the actual demand, such as a full angle 992, a half angle 994, and a half angle 996, etc. as shown in FIG. 10. For example, the white light can be designed to be emission in the full angle 992 (such as 120 degrees), and the blue light emission in the full angle 994 (such as 70 degrees). In FIG. 10, when the two lines that extend outwards from the angles of the openings of the full angle 992 and the half angle 994 intersect, which means that the lights will be mixed at this intersection. The conventional condition is that the two lines that extend outwards from the angles of the openings of the full angle 992 and the half angle 994 will not intersect, so that each of the light-emitting points emits a single-color light. Therefore, in the present invention, the quality of the mixed light can be controlled via changing the structure of the base, thereby making the colored light have the same uniformities at all the angles on the entire signboard. This advantage is a revolutionary breakthrough, thereby improving the conventional phenomenon of the unbalanced color tones caused by the different view angles at the full-color signboard. Furthermore, the module design in the present invention will make the outdoor large-scale chromatic signboards, indoor chromatic signboards, or micro-scale LED chromatic signboards have excellent purity of color, and the colored tone of the full-color display device in the present invention will not have color deviation in vision due to different locations where observers are located.

Figure 11:
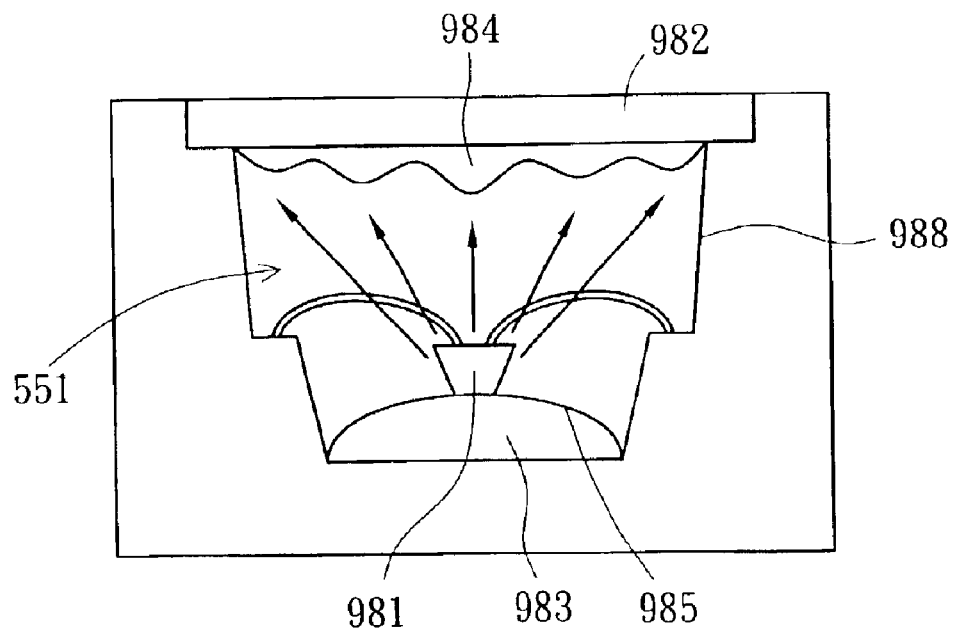
FIG. 11 is a diagram showing the full-color LED display device according to another embodiment of this invention, wherein the light-emitting element is located on the bottom of the opening and is directly electrically connected to the electrode part.
Figure 12:
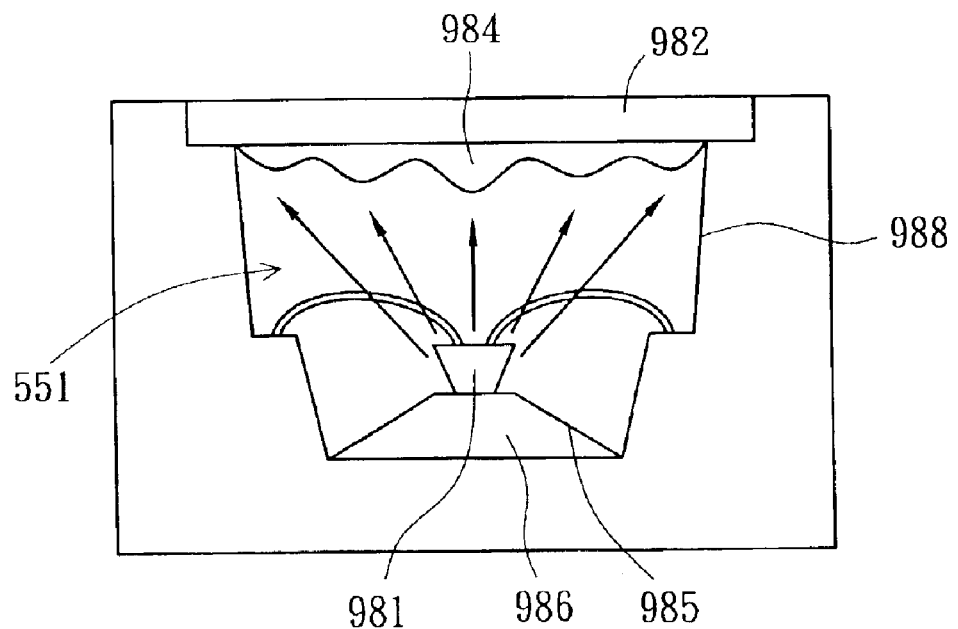
FIG. 12 is a diagram showing the full-color LED display device according to still another embodiment of this invention, wherein the light-emitting element is located on the bottom of the opening and is directly electrically connected to the electrode part.

Besides, those shown in FIG. 9 can be changed to those as shown in FIG. 11 and FIG. 12. In FIG. 11, either a fluorescent powder 984 can be coated on the lower surface of the transparent conductive substrate 982, or a fluorescent powder 985 can be coated on the reflective layer 983; or both. The fluorescent powder 984 is coated in an un-uniform wave shape via optical design. Since the light, intensity at the front of the light-emitting element 981 is not the same in every region, hence the coating of the fluorescent power 984 of wave shape, which is designed in accordance to the light emission far field of the front of the light-emitting element 981, can make the mixed light (the light mixed from the original light emitted by the light-emitting element 981 and the light produced by exciting the fluorescent power 984) of the whole device more uniform, thereby improving the condition in which the mixed light are apparently different in the inner ring and outer ring while the uniform coating of the fluorescent power 984 is applied. This design can effectively improve the condition in which the light emission wavelengths and brightness in the inner ring and outer ring are not uniform while the principle of double-waves light or triple-waves light is applied to manufacture the light-emitting element, and especially, this design can further make the performance of the white-light element gain apparent improvement. In addition, when light is emitted out from the side of the light-emitting element 981, the fluorescent power 984 along the path of the emitted light does not need to be too thick since the light intensity thereof is always weaker than that at the front. Otherwise, not only the intensity will be affected after the light is mixed but also the wavelengths and brightness are apparently different in the inner ring and outer ring of the light-emitting element 981 due to un-uniformly mixed light. Such the disadvantage is the reason why the light emitted by the conventional light-emitting element 981 manufactured via the principle of mixing light in the inner ring and outer ring is different apparently. With the use of the present invention, such the phenomenon can be improved completely. Moreover, as shown in FIG. 12, the material of the reflective layer 986 can be GaP, ZnSe, AlGaAs/ITO (AlGaAs formed on an ITO substrate), AlInGaP/GaAs (AlInGaP formed on a GaAs substrate), AlInGaP/GaP (AlInGaP formed on a GaP substrate), AlInGaP/Glass (AlInGaP formed on a glass substrate), AlInGaP/Sapphire (AlInGaP formed on a sapphire substrate), or AlGaAs/GaP (AlGaAs formed on a GaP substrate).

With the same reason, the transparent conductive substrate 982 can be a thin film or a substrate made of the material such as GaP, ZnSe, AlGaAs, or AlInGaP, etc.; or the transparent conductive substrate 982 can be made of a thin film composed of the aforementioned materials formed on a GaP substrate, a glass substrate, a sapphire substrate, an ITO substrate, an IZO substrate, a ZnO substrate, a NiO substrate, or a CTO substrate.

Figure 13:
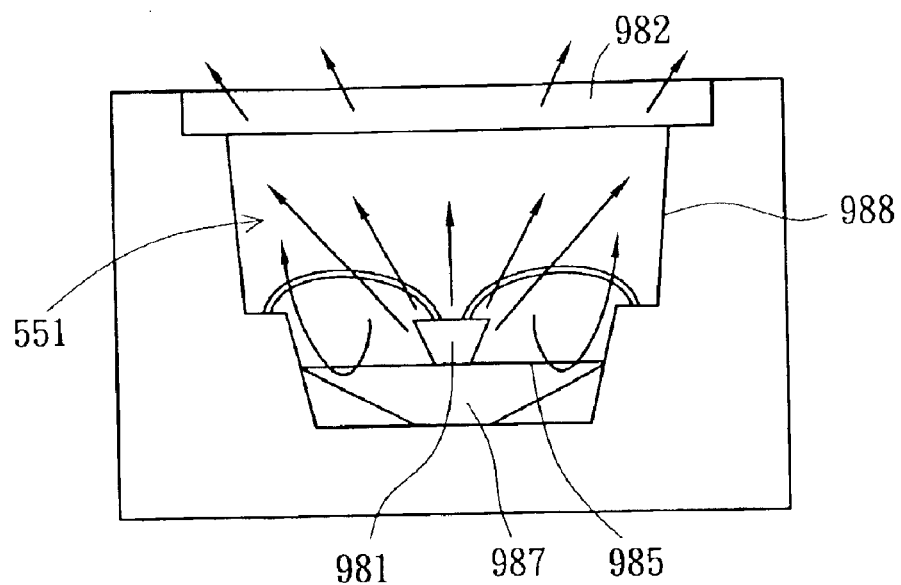
FIG. 13 is a diagram showing the full-color LED display device according to further another embodiment of this invention, wherein the light-emitting element is located on the bottom of the opening and is directly electrically connected to the electrode part.

When the material of the transparent conductive substrate 982 is GaP, ZnSe, AlInGaP/GaP, AlGaAs/GaAs, AlInGaP/GaAs, or AlGaAs/GaP, the fluorescent powder 984 can be waived, such as shown in FIG. 13.

Further, no matter whether the fluorescent powder 984 is used, the trapezoid shape of the reflective layer 986 as shown in FIG. 12 can be placed upside down, such as shown in FIG. 13. Besides, in FIGS. 11 to 13, in addition to the fluorescent powder 984 or the fluorescent powder 985, the fluorescent powder 988 can be coated on the sidewall of the opening 551.

Please refer to FIG. 13. When a GaP green-light epitaxial chip is used to be the transparent conductive substrate 982 and the reflective layer 987 is made of the material such as an AlInGaP or AlGaAs red-light epitaxial layer formed on a GaP substrate, a glass substrate, a sapphire substrate, an ITO substrate, an IZO substrate, a ZnO substrate, a NiO substrate, or a CTO substrate, the light emitted by the blue-light light-emitting element 981 can excite the GaP green-light epitaxial layer to produce the green light, and the blue-light can excite the AlInGaP or AlGaAs red-light epitaxial layer to produce the red light, thereby forming a white-light device in which the white light is mixed from the three basic colors such as red, blue, and green.

To sum up the aforementioned statement according to FIGS. 11–13, the following conclusion can be obtained. First of all, the fluorescent powder 984 can be coated on the transparent conductive substrate 982, or/and the transparent conductive substrate 982 having the function of changing the light emission wavelength can be used, i.e. the transparent conductive substrate 982 that can react with the incident light can be selected, such as GaP or ZnSe; or/and the transparent conductive substrate 982 can be formed by forming the epitaxial layer (not shown) having the specific wavelength on the lower surface of the substrate. Moreover, the fluorescent powder 985 of wave shape can be coated on the reflective layer 983 selectively, i.e. a layer of fluorescent powder 985 can be coated on the reflective layer 983; or the appropriate fluorescent powder can be selected to be coated on the reflective layer 983 and on the lower or upper surface of the light-emitting element 981 via the particular structure; or the specific substrate or structure having the function of changing/modulating the wavelength of the incident light can be adopted, thereby obtaining the white light mixed from the multi-wavelengths and other colored light. Further, the fluorescent powder can be coated on the transparent conductive substrate 982 or/and the reflective layer 983 arbitrarily. In addition, the result of mixing multi-wavelengths can be achieved by the structure made of different combinations of the fluorescent powder, the epitaxial layer, and the wafer carrier (not shown in FIGS. 11 to 13; but please referring to FIG. 14 and FIG. 15) which carries the light-emitting elements 981 and is located below the light-emitting elements 981. For example, the transparent conductive substrate 982 made of GaP or ZnSe can be used, and the fluorescent powder 985 is coated on the reflective layer 986 or the reflective layer 987 and excited to emit lights via the feature that the LED chip can emit light itself. At the same time, when the light emitted by the chip penetrates the GaP or ZnSe substrate, another colored light can be produced due to energy conversion, thereby producing a colored light having the mixed three wavelengths and mixing colors arbitrarily into arbitrary colors by the principle that the full-color light can be composed of the three basic colors; or, the fluorescent powder 984 can be coated on the transparent conductive substrate 982 and the wafer carrier having the function of changing wavelengths can be selected in order to form the colored light mixed from three wavelengths. For example again, since the blue-light is selected to be a spontaneous light source, the fluorescent powder 984 is coated on the transparent conductive substrate 982 by the way of normal coating or wave-shape coating, and the structure made of the epitaxial layer emitting the red light and the appropriate substrate is used to be a wafer carrier, hence the blue light emitted by the chip, the green light caused after the blue light excites the fluorescent powder 984, and the red light caused after the blue light excites AlGaAs can be mixed in order to form a white-light device, wherein the white light is composed of the three basic colors, such as red, blue, and green. Or, the fluorescent powder 984 can be coated on the transparent conductive substrate 982 and the wafer carrier having the function of changing the wavelength can be selected, and the fluorescent powder 988 can be coated on the sidewall of the opening 551, thereby causing the mixture of four wavelengths. Or, the transparent conductive substrate 982 can be used wherein an epitaxial layer is located below the transparent conductive substrate 982, the fluorescent powder 984 can be coated on the surface of the epitaxial layer, and the wafer carrier having the function of changing the wavelength can be selected, thereby causing the mixture of four wavelengths. Moreover, the material of the aforementioned wafer carrier can be the same as the material of the transparent conductive substrate 982. That is, the material of the wafer carrier can be GaP, ZnSe, AlInGaP/GaP, AlInGaP/Glass, AlInGaP/Sapphire, AlInGaP/GaAs, AlGaAs/GaAs, AlGaAs/GaP, AlGaAs/Glass, AlGaAs/Sapphire, GaP/Glass, GaP/Sapphire, ZnO, GaP/CTO, GaP/ZrO$_2$, or GaP/AZO.

Or, the material of the wafer carrier can also be AlInGaP formed on the ITO, ZnO, CTO, IZO, ZrO$_2$, or AZO substrate. Or, the material of the wafer carrier can also be AlGaAs formed on the ITO, ZnO, CTO, IZO, ZrO$_2$, or AZO substrate.

Figure 14:
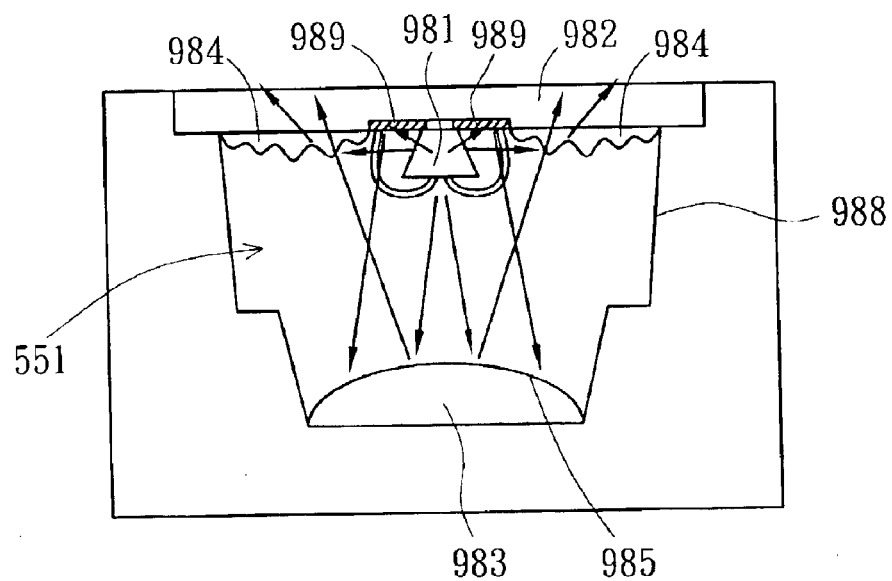
FIG. 14 is a diagram showing the full-color LED display device according to an embodiment of this invention, wherein the wafer carrier is fixed to the lower surface of the transparent conductive substrate, and the light-emitting element is fixed to the lower surface of the wafer carrier.
Figure 15:
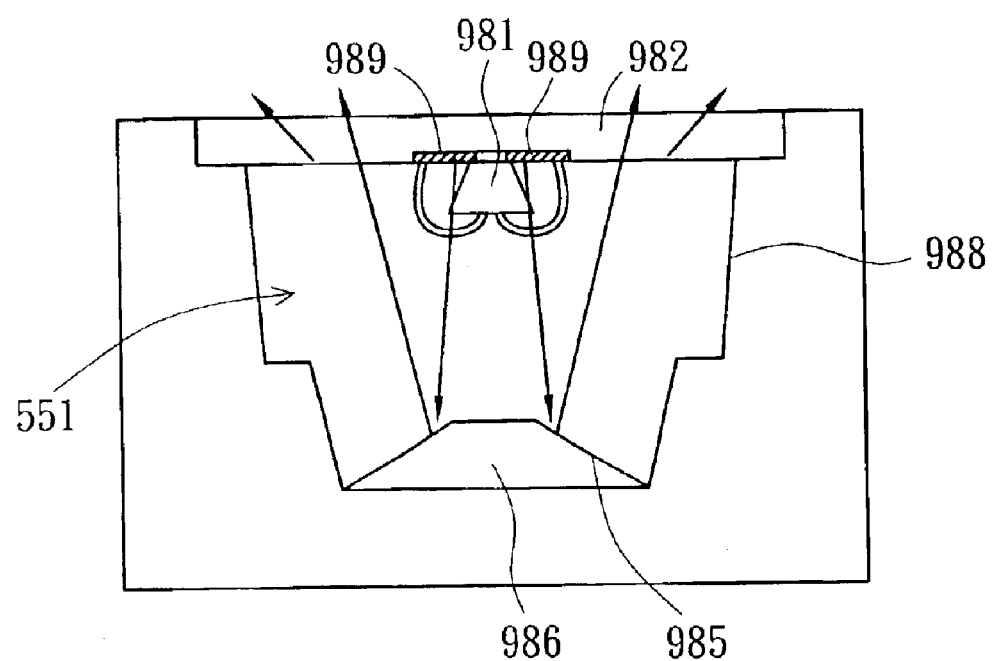
FIG. 15 is a diagram showing the full-color LED display device according to another embodiment of this invention, wherein the wafer carrier is fixed to the lower surface of the transparent conductive substrate, and the light-emitting element is fixed to the lower surface of the wafer carrier.

Of course, the aforementioned method of changing the wavelength can be applied in the condition that the light-emitting element 981 is located on the top of the opening 551. Please refer to FIG. 14 and FIG. 15. In FIG. 14 and FIG. 15, the wafer carrier 989 is fixed to the lower surface of the transparent conductive substrate 982, and the light-emitting element 981 is fixed to the lower surface of the wafer carrier 989. Further, the method of changing the wavelength shown in FIG. 14 and FIG. 15 is the same as the aforementioned method addressed according to FIGS. 11–13, and will not be addressed again accordingly.

As is understood by a person skilled in the art, the foregoing preferred embodiments of the present invention are illustrations of the present invention rather than limitations of the present invention. It is intended to cover various modifications and similar arrangements comprised within the spirit and scope of the appended claims, the scope of which should be accorded the broadest interpretation so as to encompass all such modifications and similar structure.

What is claimed is:

1. A full-color display device comprising a plurality of pixel units, wherein each of the plurality of pixel units comprises:
    a base having at least three openings, wherein a bottom of each of the at least three openings is a reflective surface;
    a plurality of transparent conductive substrates respectively covering the at least three openings;
    a plurality of light-emitting elements, wherein each of the plurality of light-emitting elements is respectively disposed on a side of each of the plurality of transparent conductive substrates, and each of the plurality of light-emitting elements is respectively held in each of the at least three openings; and
    a plurality of electrode parts, wherein the plurality of electrode parts are formed on the base, and the plurality of electrode parts are respectively electrically connected to a plurality of electrodes of the plurality of transparent conductive substrates.

2. The full-color display device according to claim 1, wherein the plurality of light-emitting elements are selected from a group consisting of light-emitting diode chip (LED chip), organic light-emitting diode (OLED), and laser diode.

3. The full-color display device according to claim 1, wherein a light emitted by each of the plurality of light-emitting elements is respectively reflected out by the reflective surface.

4. The full-color display device according to claim 1, wherein a light emitted by each of the plurality of light-emitting elements is respectively emitted out through each of the plurality of transparent conductive substrates.

5. The full-color display device according to claim 1, wherein one part of a light emitted by each of the plurality of light-emitting elements is emitted out through each of the plurality of transparent conductive substrates, and another part of the light emitted by each of the plurality of light-emitting elements is reflected out by the reflective surface.

6. The full-color display device according to claim 1, wherein an inner wall of each of the at least three openings has a light-reflecting layer.

7. The full-color display device according to claim 1, wherein the reflective surface is selected from a group consisting of a convex curved surface and a concave curved surface.

8. The full-color display device according to claim 7, wherein an angle at which a reflective light reflected by the concave curved surface depends on a curvature of the concave curved surface.

9. The full-color display device according to claim 1, wherein the reflective surface comprises a first fluorescent layer, a second fluorescent layer, and a third fluorescent layer, thereby changing a wavelength of a light via the reflective surface.

10. The full-color display device according to claim 9, wherein the first fluorescent layer changes the wavelength of the light via the reflective surface, thereby enabling at least one of the plurality of pixel units of the full-color display device to emit a red light.

11. The full-color display device according to claim 9, wherein the second fluorescent layer changes the wavelength of the light via the reflective surface, thereby enabling at least one of the plurality of pixel units of the full-color display device to emit a green light.

12. The full-color display device according to claim 9, wherein the third fluorescent layer changes the wavelength of the light via the reflective surface, thereby enabling at least one of the plurality of pixel units of the full-color display device to emit a blue light.

13. The full-color display device according to claim 1, wherein the material of the base is selected from a group consisting of ceramic material, metal material, alloy material, crystalline material, and semiconductor material.

14. The full-color display device according to claim 1, wherein each of the plurality of transparent conductive substrates comprises:
    a transparent plate;
    a transparent electrode thin film formed on the transparent plate; and
    an insulating part formed on the transparent plate, wherein the insulating part divides the transparent electrode thin film into a first transparent electrode thin film area and a second transparent electrode thin film area that are not mutually electrically conducted to each other, wherein the first transparent electrode thin film area and the second transparent electrode thin film area are respectively electrically connected to two electrodes of each of the plurality of light-emitting elements, and the first transparent electrode thin film area and the second transparent electrode thin film area are respectively electrically connected to two of the plurality of electrode parts.

15. The full-color display device according to claim 14, wherein the first transparent electrode thin film area and the second transparent electrode thin film area are respectively electrically connected to the two electrodes of each of the plurality of light-emitting elements in a way of wire bond.

16. The full-color display device according to claim 14, wherein the first transparent electrode thin film area and the second transparent electrode thin film area are respectively electrically connected to the two electrodes of each of the plurality of light-emitting elements in a way of flip-chip.

17. The full-color display device according to claim 14, wherein the transparent plate thereon further comprises an optically-filtering coating.

18. The full-color display device according to claim 14, wherein the material of the transparent electrode thin film is selected from a group consisting of ITO, ZnO, CTO, IZO, ZrO2, and AZO.

19. The full-color display device according to claim 14, wherein the material of the transparent electrode thin film is selected from a group consisting of ITO, ZnO, CTO, IZO, ZrO2, and AZO.

20. The full-color display device according to claim 1, wherein the plurality of electrode parts are surface mounted devices (SMD).

21. The full-color display device according to claim 1, wherein each of the plurality of light-emitting elements is suspended from the bottom of each of the at least three openings.

22. A full-color display device comprising a plurality of pixel units, wherein each of the plurality of pixel units comprises:
- a base having at least three openings, wherein a bottom of each of the at least three openings is a reflective surface;
- a plurality of transparent conductive substrates respectively covering the at least three openings;
- a plurality of light-emitting elements, wherein each of the plurality of light-emitting elements is respectively held in each of the at least three openings, and each of the plurality of light-emitting elements is respectively disposed on the bottom of each of the at least three openings; and
- a plurality of electrode parts, wherein the plurality of electrode parts are formed on the base, and the plurality of electrode parts are respectively electrically connected to a plurality of electrodes of the plurality of transparent conductive substrates.

23. The full-color display device according to claim 22, wherein the electrode parts are of stair-shape.

24. The full-color display device according to claim 22, further comprising a plurality of conductive wires, wherein the plurality of light-emitting elements are electrically connected to the electrode parts by the plurality of conductive wires in a way of wire bond.

25. A full-color display device comprising a plurality of pixel units, wherein each of the plurality of pixel units comprises:
- a base having an opening, wherein a bottom of the opening is a reflective surface;
- a transparent conductive substrate covering the opening;
- three light-emitting elements, wherein the three light-emitting elements are disposed on a side of the transparent conductive substrate, and the three light-emitting elements are held in the opening; and
- two electrode parts, wherein the two electrode parts are formed on the base, and the two electrode parts are respectively electrically connected to two electrodes of the transparent conductive substrate.

26. The full-color display device according to claim 25, wherein three light-emitting elements are selected from a group consisting of LED chip, OLED, and laser diode.

27. The full-color display device according to claim 25, wherein a light emitted by each of the three light-emitting elements is respectively reflected out by the reflective surface.

28. The full-color display device according to claim 25, wherein a light emitted by each of the three light-emitting elements is respectively emitted out through the transparent conductive substrate.

29. The full-color display device according to claim 25, wherein one part of a light emitted by each of the three light-emitting elements is emitted out through the transparent conductive substrate, and another part of the light emitted by each of the three light-emitting elements is reflected out by the reflective surface.

30. The full-color display device according to claim 25, wherein an inner wall of the opening has a light-reflecting layer.

31. The full-color display device according to claim 25, wherein the reflective surface is selected from a group consisting of a convex curved surface and a concave curved surface.

32. The full-color display device according to claim 25, wherein the material of the base is selected from a group consisting of ceramic material, metal material, alloy material, crystalline material, and semiconductor material.

33. The full-color display device according to claim 25, wherein the transparent conductive substrate comprises:
- a transparent plate;
- a transparent electrode thin film formed on the transparent plate; and
- a plurality of insulating parts formed on the transparent plate, wherein the plurality of insulating parts divide the transparent electrode thin film into a plurality of first transparent electrode thin film areas as a plurality of positive electrodes of the transparent conductive substrate and at least one second transparent electrode thin film area as at least one negative electrode of the transparent conductive substrate, wherein the plurality of first transparent electrode thin film areas and the at least one second transparent electrode thin film area are not mutually conducted to each other, and are respectively electrically connected to two electrodes of each of the three light-emitting elements, and are respectively electrically connected to the two electrode parts.

34. The full-color display device according to claim 33, wherein the plurality of first transparent electrode thin film areas and the at least one second transparent electrode thin film area are respectively electrically connected to the two electrodes of each of the three light-emitting elements in a way of wire bond.

35. The full-color display device according to claim 33, wherein the plurality of first transparent electrode thin film areas and the at least one second transparent electrode thin film area are respectively electrically connected to the two electrodes of each of the three light-emitting elements in a way of flip-chip.

36. The full-color display device according to claim 33, wherein the transparent plate thereon further comprises an optically-filtering coating.

37. The full-color display device according to claim 33, wherein the material of the transparent electrode thin film is selected from a group consisting of ITO, ZnO, CTO, IZO, ZrO2, and AZO.

38. The full-color display device according to claim 33, wherein the material of the transparent electrode thin film is selected from a group consisting of ITO, ZnO, CTO, IZO, ZrO2, and AZO.

39. The full-color display device according to claim 25, wherein the two electrode parts are surface mounted devices (SMD).

40. The full-color display device according to claim 25, wherein the three light-emitting elements are suspended from the bottom of the opening.

41. A full-color display device comprising a plurality of pixel units, wherein each of the plurality of pixel units comprises:
- a base having at least one opening, wherein a bottom of the at least one opening is a reflective surface;
- at least one transparent conductive substrate respectively covering the at least one opening; and
- at least one light-emitting element, wherein the at least one light-emitting element is respectively held in the at least one opening, and the at least one light-emitting elements is respectively disposed on the bottom of the at least one opening.

42. The full-color display device according to the claim 41, wherein material of the at least one transparent conductive substrate is selected from a group consisting of GaP, InGaP/GaP (InGaP formed on a GaP substrate), InGaP/Glass (InGaP formed on a glass substrate), and GaP/Sapphire (GaP formed on a sapphire substrate).

43. The full-color display device according to claim 42, wherein the at least one transparent conductive substrate or the bottom of the at least one opening thereon is further coated with a fluorescent powder.

44. The full-color display device according to claim 42, wherein the at least one transparent conductive substrate and the bottom of the at least one opening thereon are further coated with a fluorescent powder.

45. The full-color display device according to claim 42, wherein a sidewall of the at least one opening thereon is further coated with a fluorescent powder.

46. The full-color display device according to claim 41, wherein the material of the at least one transparent conductive substrate is selected from a group consisting of GaP, ZnSe, AlInGaP/GaP (AlInGaP formed on a GaP substrate), AlGaAs/GaAs (AlGaAs formed on a GaAs substrate), AlInGaP/GaAs (AlInGaP formed on a GaAs substrate), and AlGaAs/GaP (AlGaAs formed on a GaP substrate).

47. The full-color display device according to claim 46, wherein the bottom of the at least one opening thereon is further coated with a fluorescent powder.

48. The full-color display device according to claim 46, wherein a sidewall of the at least one opening thereon is further coated with a fluorescent powder.

49. The full-color display device according to claim 41, wherein the material of the at least one transparent conductive substrate is selected from a group consisting of GaP, ZnSe, AlGaAs/ITO (AlGaAs formed on an ITO substrate), AlInGaP/GaAs, AlInGaP/GaP, AlInGaP/Glass (AlInGaP formed on a glass substrate), AlInGaP/Sapphire (AlInGaP formed on a sapphire substrate), and AlGaAs/GaP.

50. The full-color display device according to claim 41, wherein each of the at least one transparent conductive substrate further comprises an epitaxial layer.

51. A full-color display device comprising a plurality of pixel units, wherein each of the plurality of pixel units comprises:

a base having at least one opening, wherein a bottom of the at least one opening is a reflective surface;

at least one transparent conductive substrate covering the at least one opening, wherein there is further an epitaxial layer on the at least one transparent conductive substrate or the reflective surface; and at least one light-emitting element, wherein the at least one light-emitting element is held in the at least one opening.

52. The full-color display device according to claim 51, further comprising at least one fluorescent powder, wherein a position on which the at least one fluorescent powder is coated is selected from a group consisting of the reflective surface, a sidewall of the at least one opening, the at least one transparent conductive substrate, and the epitaxial layer.

53. The full-color display device according to claim 51, wherein the at least one light-emitting element is disposed on the bottom or a top of the at least one opening.

54. A full-color display device comprising a plurality of pixel units coated with at least one fluorescent powder, wherein each of the plurality of pixel units comprises:

a base having at least one opening, wherein a bottom of the at least one opening is a reflective surface;

at least one transparent conductive substrate covering the at least one opening; and at least one light-emitting element held in the at least one opening.

55. The full-color display device according to claim 54, wherein a position on which the at least one fluorescent powder is coated is selected from a group consisting of the reflective surface, a sidewall of the at least one opening, and the at least one transparent conductive substrate.

56. The full-color display device according to claim 55, further comprising an epitaxial layer, wherein a position of the epitaxial layer is selected from a group consisting of on the at least one transparent conductive substrate and on the reflective surface.

57. The full-color display device according to claim 56, wherein the at least one fluorescent powder is coated on the epitaxial layer.

58. The full-color display device according to claim 54, wherein the at least one light-emitting element is disposed on the bottom or a top of the at least one opening.

* * * * *